United States Patent
Atsumi et al.

(10) Patent No.: US 6,215,808 B1
(45) Date of Patent: Apr. 10, 2001

(54) LASER APPARATUS, EXPOSURE APPARATUS, LITHOGRAPHY SYSTEM, METHOD FOR PRODUCING CIRCUIT ELEMENTS, GAS SUPPLY SYSTEM AND GAS SUPPLY METHOD

(75) Inventors: Shinobu Atsumi, Ota-ku; Masato Hamatani, Kounosu, both of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/655,067

(22) Filed: Sep. 5, 2000

Related U.S. Application Data (63) Continuation of application No. 09/065,515, filed on Apr. 24, 1998, now abandoned.

(30) Foreign Application Priority Data

Apr. 25, 1997 (JP) .................................................. 9-123328

(51) Int. Cl.$^7$ .................................................. H01S 3/225
(52) U.S. Cl. .................................. 372/58; 372/57; 372/59
(58) Field of Search .......................................... 372/57–59

(56) References Cited

U.S. PATENT DOCUMENTS

| | | | |
|---|---|---|---|
| 4,547,885 | 10/1985 | Allen et al. | 372/58 |
| 4,912,718 | 3/1990 | Klingel | 372/58 |
| 5,090,020 | 2/1992 | Bedwell | 372/59 |
| 5,383,217 | 1/1995 | Uemura | 372/58 |
| 5,534,970 | 7/1996 | Nakashima et al. | 355/53 |
| 5,559,584 | 9/1996 | Miyaji et al. | 355/73 |

FOREIGN PATENT DOCUMENTS

| | | | |
|---|---|---|---|
| 62-252183 | 11/1987 | (JP) | 372/58 |
| 8-288225 | 11/1996 | (JP) . | |
| 9-246672 | 9/1997 | (JP) . | |

OTHER PUBLICATIONS

Partial English-language translation of JP-9-246672. (FP above).

Primary Examiner—John D. Lee
(74) Attorney, Agent, or Firm—Oliff & Berridge PLC (57) ABSTRACT

A laser apparatus comprises a plurality of laser beam sources which use, as laser media, mixed gases containing at least one common gas component; at least one common gas supply source for supplying, to the respective laser beam sources, the common gas component for constituting the mixed gases; and one or more gas flow amount-adjusting units for adjusting flow amounts of the common gas component supplied from the common gas supply source and other gas components for constituting the mixed gases so that the gas components are supplied to the respective gas laser beam sources. It is unnecessary to provide gas tanks for each of the laser beam sources. The arrangement of the gas supply equipment is simplified, and the safety is improved. A plurality of the laser apparatuses are preferably installed to a circuit element production line provided with a plurality of exposure apparatuses.

57 Claims, 3 Drawing Sheets

LASER APPARATUS, EXPOSURE APPARATUS, LITHOGRAPHY SYSTEM, METHOD FOR PRODUCING CIRCUIT ELEMENTS, GAS SUPPLY SYSTEM AND GAS SUPPLY METHOD

This is a continuation of application Ser. No. 09/065,515 filed Apr. 24, 1998 (abandoned). The entire disclosure of the prior application(s) is hereby incorporated by reference herein in its entirety.

BACKGROUND OF THE INVENTION

1. Field of the Invention

The present invention relates to a laser apparatus, an exposure apparatus, a lithography system, and a method for producing circuit elements. In particular, the present invention relates to a laser apparatus based on the use of a mixed gas as a laser medium, an exposure apparatus and a lithography system for printing a fine pattern on a resist on a substrate such as a wafer by using a laser beam radiated from the laser apparatus, and a method for producing circuit elements comprising a lithography step of performing projection exposure with a mask pattern by using, as an exposure light beam, a light beam radiated from a laser beam source based on the use of a mixed gas as a laser medium. The laser apparatus according to the present invention is preferably applicable, for example, to apparatuses for producing semiconductor devices, such as exposure apparatuses and laser repair apparatuses, laser beam machining apparatuses, and lithography systems. The present invention also relates to a gas supply system and method for supplying mixed gases effectively to a plurality of gas laser sources.

2. Description of Related Art

The high power laser beam source includes a gas laser based on the use of a gas as a laser medium, which is used in a variety of fields. Especially, an excimer laser is known, in which a high power pulse laser beam is obtained. The high power pulse laser apparatus such as the excimer laser is used for the laser beam machining process and for the production process for semiconductor devices such as IC and LSI, especially for the lithography step.

The excimer laser, which is used for the applications as described above, uses a laser medium composed of a mixed gas comprising KrF (krypton fluoride) and ArF (argon fluoride). The excimer laser uses a mixture comprising several percent of Kr (krypton) and $F_2$ (fluorine), or Ar (argon) and $F_2$ (fluorine) respectively, and it uses Ne (neon) as a buffer gas. These components are proportionally mixed in an optimum mixing ratio in conformity with manufacturers of the laser. However, the mixing ratio changes while the laser is used. For this reason, in order to prolong the service life of the gas used for laser radiation and decrease the downtime during the gas exchange procedure by decreasing the amount of gas consumption, fluorine microinjection ($F_2$ injection) has been hitherto performed especially for fluorine which has strong reactivity and which tends to decrease as a result of the reaction easily caused with metals, hydrogen, and carbon contained in the laser oscillator. Specifically, the fluorine microinjection is performed by injecting a two-component mixture, i.e., $F_2$/Ne (fluorine/neon).

Recently, the development has been further advanced, making it possible to decrease deterioration of the gas and prolong the service life of the laser. However, when the fluorine microinjection is performed, it is necessary that a part of the mixed gas contained in the laser beam source is once extracted, and then a minute amount of fluorine is injected, in order to avoid abnormal increase in internal pressure. Therefore, for example, in the case of the KrF excimer laser, the concentration of krypton (Kr) is decreased every time when the fluorine microinjection is performed, and it is necessary to simultaneously inject krypton (Kr) together with fluorine. Accordingly, the two-component mixture of $F_2$/Ne, which has been hitherto used for the fluorine microinjection, is changed to a three-component mixture of $F_2$/Kr/Ne (fluorine/krypton/neon) to perform the gas injection.

As for the laser such as the excimer laser based on the use of the mixed gas as the laser medium, the optimum mixing ratio (concentration) of the mixed gas used for the laser medium differs depending on the laser manufacturers. Even when the laser medium contains a common type gas such as F as in the mixed gas including KrF and ArF, the ratio of F is different when such a mixed gas is prepared. That is, the mixing ratio of $Kr/F_2$ is mutually different from the mixing ratio of $Ar/F_2$. For this reason, for example, in the case of the KrF laser, it is necessary to prepare a gas cylinder (tank) containing Kr, for example, Kr/Ne (krypton/neon) and a gas cylinder containing $F_2$, for example, $F_2$/Ne, and it is necessary to provide any gas equipment for supplying the gases from the gas cylinders to the laser. Further, since the mixing ratio of Kr and $F_2$ differs depending on the manufacturers, it has been hitherto necessary to provide any supply equipment corresponding to each of them. The same situation also arises in the case of the ArF laser.

As described above, when the lasers produced by different makers based on different laser media are used, the gas supply apparatus (gas supply equipment) including a plurality of gas cylinders and supply lines for supplying the gases has been hitherto installed for each of the lasers. Therefore, the conventional system is not effective in view of the space and the cost. Especially, in the case of fluorine, strict management is required, because it is a toxic gas. It is necessary to provide any gas supply equipment applicable to the toxic gas for each of the lasers, and hence an excessive management burden has been hitherto imposed.

It is forecasted, for example, that the lithography step carried out in the production of semiconductor devices or the like will, in the near future, highly possibly meet the necessity for the mix-and-match exposure for performing exposure by using, on an identical production line, an exposure apparatus (such as a stepper) based on the use of the KrF excimer laser and an exposure apparatus (such as a stepper) based on the use of the ArF excimer laser. In such a case, an inconvenience also arises in that an excessive installation space and an excessive cost are required, if the gas supply equipment applicable to the toxic gas is prepared for each of the exposure apparatuses as performed in the conventional system. It has been feared that such an inconvenience may cause a bottleneck when the mix-and-match exposure system is introduced.

SUMMARY OF THE INVENTION

The present invention has been made taking the foregoing circumstances into consideration, an object of which is to provide a laser apparatus and an exposure apparatus which make it possible, for example, to reduce the cost and mitigate the burden of management of the laser apparatus based on the use of a plurality of gas laser beam sources which use, as laser media, mixed gases containing a common component.

Another object of the present invention is to provide a lithography system which makes it possible to introduce the mix-and-match exposure based on the use of a plurality of gas lasers while saving the space and reducing the cost.

Still another object of the present invention is to provide a method for producing circuit elements, which makes it possible to produce circuit elements such as semiconductor devices at low cost.

A further object of the present invention is to provide a gas supply system and method for supplying mixed gases to a plurality of laser sources effectively, which make it possible to produce circuit elements such as semiconductor devices at low cost.

According to a first aspect of the present invention, there is provided a laser apparatus comprising:

- a plurality of laser beam sources which use, as laser media, mixed gases containing at least one common gas component;
- at least one common gas supply source which supplies, to the respective laser beam sources, the common gas component; and
- a gas flow amount-adjusting unit which adjusts a flow amount of the common gas component supplied from the common gas supply source.

The laser apparatus comprises the plurality of gas lasers which use, as the laser media, the mixed gases containing the common component respectively. In the present invention, the common component is supplied from the common gas supply source to the gas flow amount-adjusting unit, and the flow amounts are appropriately adjusted together with the other gas components for constituting the appropriate mixed gases so that these gas components are supplied to the respective laser beam sources in predetermined ratios. Accordingly, it is unnecessary to provide excessive gas cylinders for each of the laser beam sources. Thus, a simple gas supply equipment can be constructed. Especially, for example, when a toxic gas (such as fluorine) is contained in the medium gas, the management for safety can be performed more easily, because it is possible to decrease the number of supply sources of the toxic gas. Thus, it is possible to reduce the management labor and the cost. The gas flow amount-adjusting unit can be used to adjust the gases supplied from the plurality of gas supply sources to give a desired gas flow amount so that the optimum gas for the laser medium is supplied to each of the laser beam sources. The gas flow amount-adjusting unit may be used such that the plurality of supplied gases are mixed with each other to give a desired gas mixing ratio.

The laser apparatus of the present invention includes the gas flow amount-adjusting unit which may be provided for each of the laser beam sources. In this embodiment, even when the composition of the mixed gas differs as the laser medium for each of the laser beam sources, the mixed gas can be supplied in an optimum composition and at a desired concentration to each of the laser beam sources by using the gas flow amount-adjusting unit provided for each of the laser beam sources.

The laser apparatus may comprise, for example, a combination of KrF and ArF excimer lasers, a combination of KrF and KrF excimer lasers, or a combination of ArF and ArF excimer lasers as the laser beam sources. The common gas component may be fluorine, Neon, Argon, and/or Krypton.

In this embodiment, fluorine may be supplied from the common gas supply source according to the present invention.

According to a second aspect of the present invention, there is provided an exposure apparatus for illuminating masks with light beams radiated from laser beam sources, and exposing a substrate with patterns formed on the masks, the exposure apparatus comprising:

- a plurality of laser beam sources which use, as laser media, mixed gases containing at least one common gas component;
- a plurality of exposure apparatus bodies which expose the substrate with the light beams radiated from the plurality of laser beam sources;
- a common gas supply source for supplying the common gas component; and
- a gas flow amount-adjusting unit which adjusts a flow amount of the common gas component supplied from the common gas supply source.

The exposure apparatus of the present invention includes the plurality of gas laser beam sources and the exposure apparatus bodies corresponding to the respective laser beam sources. The plurality of laser beam sources use the mixed gases as the laser media. At least one component of the mixed gases is commonly used for at least two laser media of the laser beam sources. Accordingly, the space required to install the exposure apparatus can be saved, and the production cost can be lowered by commonly using the gas supply source. When a toxic gas such as fluorine is contained as the common component of the mixed gases for the plurality of laser beam sources, the toxic gas can be collectively managed by using the common gas supply source. Therefore, it is possible to improve the safety of the exposure apparatus. Accordingly, the exposure apparatus of the present invention is preferably used for the mix-and-match exposure in which overlay exposure is performed by using exposure light beams having different wavelengths.

According to a third aspect of the present invention, there is provided a lithography system to be used for an exposure step performed on an identical production line, the lithography system comprising:

- a plurality of laser beam sources which use, as laser media, mixed gases containing at least one common gas component;
- a plurality of exposure apparatus bodies which expose the substrate with light beams radiated from the plurality of laser beam sources, the plurality of exposure apparatus bodies being installed on the identical production line;
- a common gas supply source which supplies the common gas component for constituting the mixed gases; and
- at least one gas flow amount-adjusting unit which adjusts flow amounts of the common gas component supplied from the common gas supply source and other gas components for constituting the mixed gases.

For example, when the exposure based on the use of the light beam having an oscillation wavelength of the KrF excimer laser is performed on the same production line as that for the exposure based on the use of the light beam having an oscillation wavelength of the ArF excimer laser (mix-and-match exposure), the use of the lithography system of the present invention makes it possible to store the fluorine gas as the common gas component in the common gas supply source. Therefore, the lithography system is advantageous from viewpoints of the cost, the safety, and the space required for the production line. Since the present system includes the gas flow amount-adjusting unit, the gas component, which is supplied from the common gas supply source, is subjected to the adjustment for the flow amounts together with the other gases by the aid of the gas flow amount-adjusting unit to give the mixed gases which are optimum as the laser media for the respective laser beam sources. The gas flow amount-adjusting unit may be used to adjust the mixing ratio so that the gases are mixed with each other. The gas flow amount-adjusting unit may be provided as a single unit. Alternatively, the gas flow amount-adjusting unit may have a plurality of mass flow controllers each of which is provided for respective laser beam sources.

According to a fourth aspect of the present invention, there is provided a method for producing circuit elements, comprising a lithography step, the method further comprising the steps of using a common gas supplied from a common gas supply source, as a component of a first mixed gas for constituting a gas laser medium for a first laser beam source; using the common gas supplied from the common gas supply source, as a component of a second mixed gas for constituting a gas laser medium for a second laser beam source; irradiating a first mask with a laser beam having a wavelength λ1 oscillated from the first laser beam source to expose a substrate with a pattern formed on the first mask; and irradiating a second mask with a laser beam having a wavelength λ2 oscillated from the second laser beam source to expose the substrate with a pattern formed on the second mask.

According to this method, even when the gas lasers for oscillating the laser beams having the different wavelengths are used, if they use the mixed gases as the laser media containing fluorine as the common component respectively as in ArF and KrF, then the space for producing circuit elements can be reduced by commonly using the supply source of fluorine, and thus the production cost can be lowered. The gas supplied from the common gas supply source can be mixed with the other gases in a desired mixing ratio for each of the lasers so that the mixed gas may be supplied to each of the lasers. When the common gas is a toxic gas, the safety is improved during the production of circuit elements. The wavelength λ1 may be identical with or different from the wavelength λ2.

According to a fifth aspect of the present invention, there is provided a gas supply system which supplies mixed gases to a plurality of laser beam sources comprising:
  at least one common gas supply source which supplies, to the respective laser beam sources, the common gas component; and
  a gas flow amount-adjusting unit which adjusts a flow amount of the common gas component supplied from the common gas supply source.

In the gas supply system, the laser beam sources may comprise a combination of excimer lasers selected from a group consisting of KrF and ArF excimer lasers, KrF and KrF excimer lasers, and ArF and ArF excimer lasers, and the common gas component is fluorine.

According to a sixth aspect of the present invention, there is provided a gas supply system which supplies mixed gases to a plurality of laser beam sources comprising:
  a first common gas supply source which supplies, to the respective laser beam sources, the first common gas component for constituting the mixed gases; and
  a second common gas supply source which supplies, to the respective laser beam sources, the second common gas component for constituting the mixed gases.

According to a seventh aspect of the present invention, there is provided a method for supplying mixed gases to a plurality of laser beam sources comprising: supplying at least one common gas to the respective laser beam sources; and adjusting a flow amount of the common gas. The method may further comprise illuminating a substrate with a laser beam from one of the laser beam sources to which the common gas was supplied, and forming a circuit pattern on the substrate to manufacture a circuit element.

DESCRIPTION OF THE PREFERRED EMBODIMENTS

First Embodiment

A first embodiment of the present invention will be explained below with reference to FIGS. 1 and 2.

Figure 1:
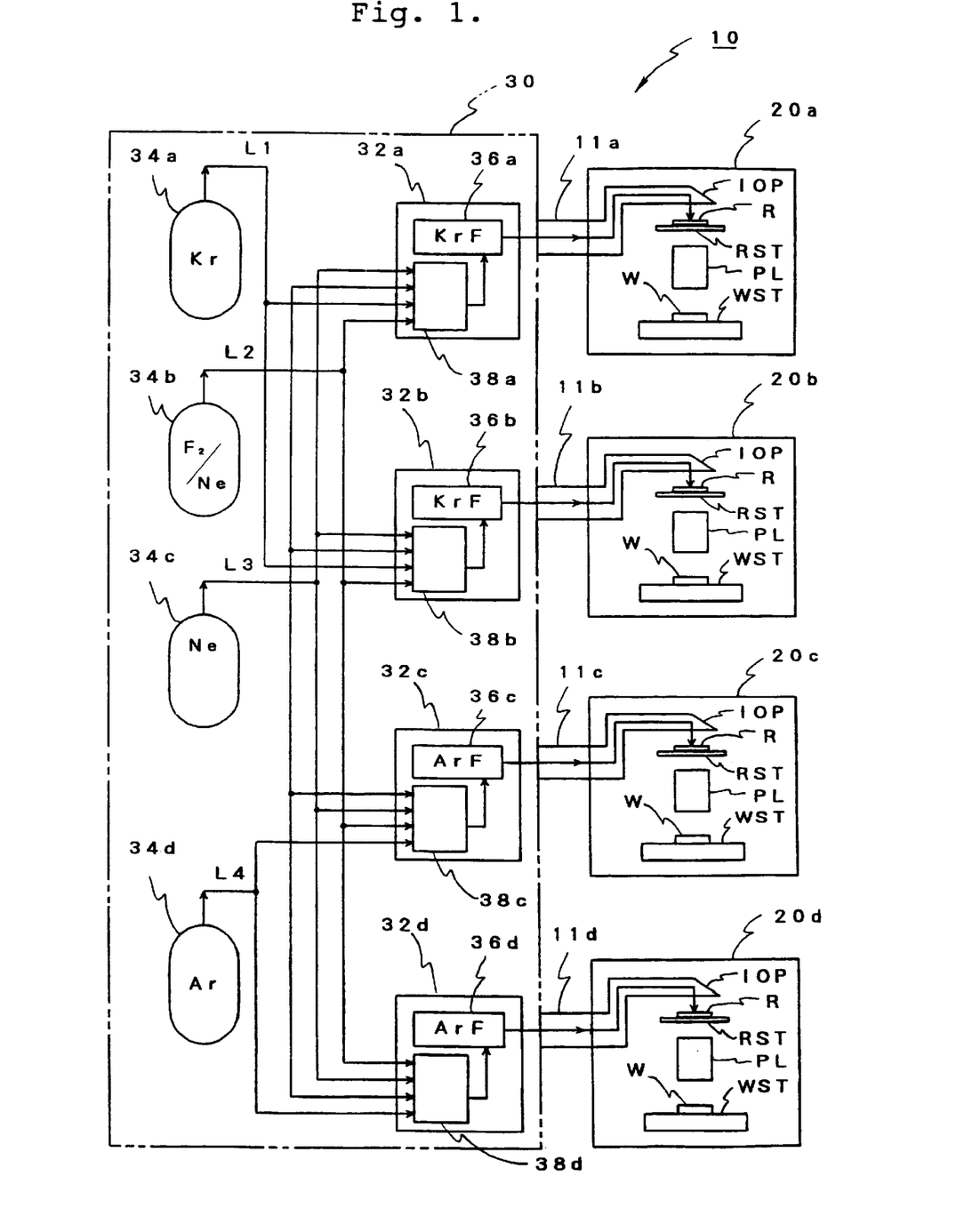
FIG. 1 schematically shows a general arrangement of a lithography system according to a first embodiment.

FIG. 1 schematically shows a general arrangement of a lithography system 10 according to the first embodiment, including a plurality of exposure apparatuses which use, as exposure light sources, laser apparatuses concerning the present invention.

The lithography system 10 comprises a plurality of main exposure apparatus bodies 20a, 20b, 20c, 20d, a laser apparatus 30 as an exposure light source for the main exposure apparatus bodies 20a, 20b, 20c, 20d, and beam matching units (hereinafter referred to as "BMU's") 11a, 11b, 11c, 11d for guiding exposure light beams radiated from the laser apparatus 30 to the main exposure apparatus bodies 20a, 20b, 20c, 20d respectively. In this embodiment, an exposure apparatus is constructed by the main exposure apparatus body 20a, BMU 11a, and the laser apparatus 30. Similarly, exposure apparatuses are constructed by the main exposure apparatus body 20b, BMU 11b, and the laser apparatus 30, by the main exposure apparatus body 20c, BMU 11c, and the laser apparatus 30, and by the main exposure apparatus body 20d, BMU 11d, and the laser apparatus 30 respectively.

The wavelength of the exposure light beam to be used differs for the main exposure apparatus bodies 20a, 20b, 20c, 20d. A KrF laser beam (wavelength: 248 nm) is used for the main exposure apparatus bodies 20a, 20b. An ArF laser beam (wavelength: 193 nm) is used for the main exposure apparatus bodies 20c, 20d. Each of the main exposure apparatus bodies 20a, 20b, 20c, 20d comprises an illumination optical system IOP for illuminating a reticle R as a mask with the exposure light beam introduced from the laser apparatus 30 as the exposure light source via each of BMU's 11a, 11b, 11c, 11d into the main exposure apparatus body, a reticle stage RST as a mask stage for holding the reticle R, a projection optical system PL for projecting a pattern formed on the reticle R onto a wafer W as a substrate, a wafer stage WST which is movable two-dimensionally in a horizontal plane while holding the wafer W, and a control system (not shown) for controlling the operation of the entire apparatus by using a computer. In this embodiment, the reduction projection exposure apparatuses (steppers) are used as the main exposure apparatus bodies 20a, 20b, 20c, 20d, for alternately repeating the projection exposure operation and the stepping operation for the wafer stage WST so that the shot areas on the wafer are successively exposed with the reticle pattern in accordance with the step-and-repeat system, the projection exposure operation being performed by illuminating the reticles R via the illumination optical systems IOP with the exposure light beams radiated from the laser apparatus 30 and guided by BMU's 11a, 11b, 11c, 11d respectively, and exposing the wafer W by projection with the patterns on the reticles R by using the projection optical systems PL. Each of the main exposure apparatus bodies 20a, 20b, 20c, 20d is, for example, constructed in the same manner as an ordinary stepper, as disclosed, for example, in U.S. Pat. Nos. 5,534,970, 5,559,584 and 5,383,217, the disclosures of which are incorporated hereinto by reference.

The laser apparatus 30 comprises excimer laser apparatuses 32a, 32b, 32c, 32d, gas cylinders (tanks) 34a, 34b, 34c, 34d as gas supply sources for supplying necessary gases to the excimer laser apparatuses 32a, 32b, 32c, 32d, and pipe lines L1 to L4 for supplying the gases necessary for the respective excimer laser apparatuses from the gas cylinders to the excimer laser apparatuses.

Each of the respective laser apparatuses 32a, 32b, 32c, 32d comprises a laser beam source 36a, 36b, 36c, 36d including a laser tube and a high voltage power source unit (both of which are not shown), a mass flow controller 38a, 38b, 38c, 38d as a gas flow amount-adjusting unit, and an unillustrated control system.

A high pressure Kr gas is stored in the gas cylinder 34a. 100% Kr is used for the gas. The pipe line L1 is connected between the gas cylinder 34a and the mass flow controllers 38a, 38b of the excimer laser apparatuses 32a, 32b. The Kr gas is supplied via the pipe line L1 to the mass flow controllers 38a, 38b.

An high pressure gas of $F_2$/Ne comprising a two-component mixture containing 1% of fluorine is stored in the gas cylinder 34b. The $F_2$/Ne mixed gas stored in the gas cylinder 34b may be a gas containing 2.5% or 5% of fluorine. However, in view of the safety management, it is desirable to use a gas having a low fluorine concentration. The pipe line L2 is connected between the gas cylinder 34b and the mass flow controllers 38a, 38b, 38c, 38d of the excimer laser apparatuses 32a, 32b, 32c, 32d. The $F_2$/Ne gas is supplied via the pipe line L2 to the mass flow controllers 38a, 38b, 38c, 38d. In this embodiment, the pipe line L2 is a passage for the mixed gas containing fluorine as a toxic gas. Therefore, the pipe line L2 is provided with instruments (not shown) such as an emergency shut-off valve and a gas sensor for managing the toxic gas.

An Ne gas, which is used as a high pressure buffer gas, is stored in the gas cylinder 34c. In this embodiment, 100% Ne is used. Alternatively, an inert gas such as an He (helium) gas may be used as the buffer gas. The pipe line L3 is connected between the gas cylinder 34c and the mass flow controllers 38a, 38b, 38c, 38d of the excimer laser apparatuses 32a, 32b, 32c, 32d. The Ne gas is supplied via the pipe line L3 to the mass flow controllers 38a, 38b, 38c, 38d.

A high pressure Ar gas is stored in the gas cylinder 34d. In this embodiment, 100% Ar is used. The pipe line L4 is connected between the gas cylinder 34d and the mass flow controllers 38c, 38d of the excimer laser apparatuses 32c, 32d. The Ar gas is supplied via the pipe line L4 to the mass flow controllers 38c, 38d.

The mass flow controllers 38a, 38b, 38c, 38d are provided in order that flow amounts of the gases supplied from the gas cylinders 34a, 34b, 34c, 34d via the pipe lines L1 to L4 are controlled respectively to supply mixed gases having appropriate mixing ratios to the laser beam sources 36a, 36b, 36c, 36d. Specifically, the mass flow controllers 38a, 38b are used respectively such that the Kr gas from the gas cylinder 34a and the $F_2$/Ne gas from the gas cylinder 34b are mixed with each other to give the mixed gases having the mixing ratios optimum as the laser media to be supplied to the laser beam sources 36a, 36b, and the Ne gas as the buffer gas stored in the gas cylinder 34c is also mixed in an appropriate amount to make supply thereto. The mass flow controllers 38c, 38d are used respectively such that the Ar gas in the gas cylinder 34d and the $F_2$/Ne mixed gas in the gas cylinder 34b are mixed with each other to give the mixed gases having the mixing ratios optimum as the laser media to be supplied to the laser beam sources 36c, 36d, and the Ne gas stored in the gas cylinder 34c is also mixed in an appropriate amount to make supply thereto.

The flow amounts of the respective gases are adjusted by the mass flow controllers 38a, 38b, 38c, 38d, corresponding to the respective laser beam sources. It is possible to supply the mixed gases in the desired optimum mixing ratios and in the desired optimum amounts, to the laser beam sources 36a, 36b, 36c, 36d respectively.

Each of the laser beam sources 36a, 36b is a KrF excimer laser which is one of the noble gas-halogen (excimer) laser based on the use of the laser medium of the mixed gas comprising Kr (noble gas) and minute amount of $F_2$ (halogen). The laser oscillation is effected to output the KrF laser beam by exciting, with short pulse large current discharge, the mixed gas of Kr and $F_2$ in the optimum mixing ratio adjusted for the flow amounts of the respective gases by the aid of the mass flow controllers 38a, 38b.

Each of the laser beam sources 36c, 36d is an ArF excimer laser which is one of the noble gas-halogen (excimer) laser based on the use of the laser medium of the mixed gas comprising Ar (noble gas) and minute amount of $F_2$ (halogen). The laser oscillation is effected to output the ArF laser beam by exciting, with short pulse large current discharge, the mixed gas of Ar and $F_2$ in the optimum mixing ratio (concentration) adjusted for the flow amounts of the respective gases by the aid of the mass flow controllers 38c, 38d.

In this embodiment, the mass flow controllers 38a, 38b, 38c, 38d can be used to always inject the mixed gases of Kr and $F_2$ or the mixed gases of Ar and $F_2$ in the optimum mixing ratios (concentrations) into the laser beam sources 36a, 36b or the laser beam sources 36c, 36d. Therefore, each of the laser beam sources 36a, 36b, 36c, 36d can maintain the optimum laser oscillation state over a long period of time.

The operation of the lithography system 10 constructed as described above will be briefly explained as follows.

Those necessary for the respective laser beam sources, of the gases stored in the gas cylinders 34a, 34b, 34c, 34d are supplied via the pipe lines L1 to L4 to the mass flow controllers 38a, 38b, 38c, 38d. The mass flow controllers 38a, 38b, 38c, 38d adjust the flow amounts of the gases supplied via the pipe lines L1 to L4 respectively so that they supply, to the laser beam sources 36a, 36b, the mixed gases in the optimum mixing ratios (concentrations) and in the optimum amounts as the KrF excimer laser media respectively, and they also supply, to the laser beam sources 36c, 36d, the mixed gases in the optimum mixing ratios (concentrations) and in the optimum amounts as the ArF excimer laser media respectively. The laser beam sources 36a, 36b effect the KrF excimer laser oscillation as described above by using, as the laser media, the gases mixed by the mass flow controllers. The laser beam sources 36c, 36d effect the ArF excimer laser oscillation as described above by using, as the laser media, the gases mixed by the mass flow controllers.

The excimer laser beams radiated from the laser beam sources 36a, 36b are introduced into the main exposure apparatus bodies 20a, 20b via BMU's 11a, 11b respectively. The excimer laser beams radiated from the laser beam sources 36c, 36d are introduced into the main exposure apparatus bodies 20c, 20d via BMU's 11c, 11d respectively. In the main exposure apparatus bodies 20a, 20b, the projection exposure is performed by using the KrF excimer laser beams to transfer the patterns formed on the reticles R onto the wafer W. In the main exposure apparatus bodies 20c, 20d, the projection exposure is performed by using the ArF excimer laser beams to transfer the patterns formed on the reticles R onto the wafer W.

Although not shown in the drawings, the respective exposure apparatuses are also connected with pipe lines for supplying He and $N_2$ gases for purging optical systems other than the oscillators of the respective laser beam sources, the respective BMU's (11a, 11b, 11c, 11d), the illumination optical systems IOP of the respective main exposure apparatus bodies, and the projection optical systems PL.

Next, a method for producing semiconductor devices, including the exposure step for performing exposure by using the lithography system 10 according to this embodiment will be explained with reference to a flow chart illustrating production steps for semiconductor circuit elements shown in FIG. 2.

Figure 2:
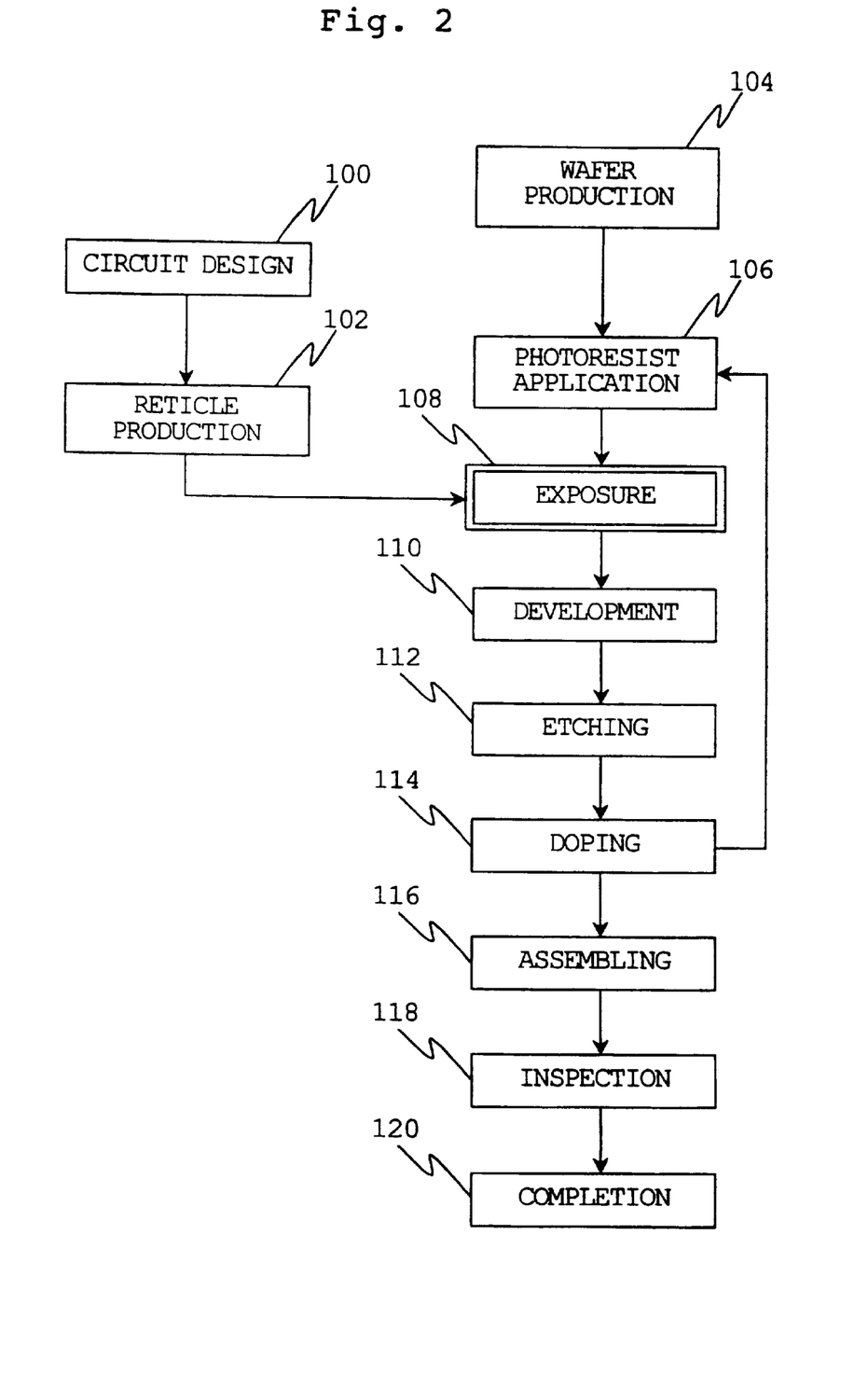
FIG. 2 shows a flow chart illustrating the production steps for semiconductor devices.

At first, in a step 100 shown in FIG. 2, logical circuit design and pattern design are performed. Next, reticles R, which are inscribed with circuit patterns for each of layers, are prepared in a step 102 on the basis of design drawings. In a step 104, a wafer W is produced with a material such as high purity silicon, concurrently with the step of preparing the reticles. A photoresist (photosensitive resin) is applied onto the wafer W in a step 106. The semiconductor device is formed by stacking multiple layers of circuit patterns on the wafer. Therefore, a plurality of reticles R corresponding to the respective layers are prepared.

Explanation will be made below for steps of processing the single wafer in order to simplify the explanation.

In an exposure step of a step 108 (the step including the exposure step and the development step is generally referred to as "photolithography step"), the reticle R and the wafer W, which have been prepared or applied with the photoresist in the foregoing steps, are set in any one of the four main exposure apparatus bodies shown in FIG. 1, for example, in the main exposure apparatus body 20a. In the main exposure apparatus body 20a, the pattern formed on the reticle R is successively transferred by exposure onto the wafer W in accordance with the step-and-repeat system by using the KrF excimer laser beam. During this process, the gases from the plurality of the gas cylinders 34a, 34b, 34c are adjusted and controlled for their flow amounts by the mass flow controller 38a respectively, and they are supplied to the laser beam source 36a of the main exposure apparatus body 20a.

In the next step 110, the exposed wafer W is immersed in a constant temperature bath, followed by being immersed in a liquid developer. Accordingly, in the case of a positive type resist, the resist portion exposed with the exposure light beam is dissolved, and the non-exposed resist portion remains (in the case of a negative type resist, the former remains, and the latter is dissolved). Thus, a resist image is formed.

In the next step 112, the oxide film of the portion (for example, $Si_3N_4$), from which the photoresist on the wafer W has been washed out, is subjected to etching by the aid of an etching solution.

In next step 114, the doping is performed to allow a substance such as phosphorus and arsenic to permeate into the area in the wafer having no resist, in order to form the circuit element such as transistors and diodes. After the doping, the resist, which is of no more use, is removed by using, for example, a plasma asher (ashing apparatus). That is, all of the photoresist is removed.

Subsequently, multiple layers of circuit patterns are formed on the wafer surface by repeating the steps ranging from the step 106 to the step 114. In this procedure, the wafer W may be subjected to the exposure for all of the plurality layers by using the same main exposure apparatus body 20a while exchanging the reticle R. However, the exposure may be performed by successively using the four main exposure apparatus bodies 20a to 20d. Alternatively, the exposure may be performed in an appropriate order by appropriately using two or three of the main exposure apparatus bodies. That is, an identical wafer may be subjected to the exposure for the respective layers in any order by using any combination of the main exposure apparatus bodies.

In any case, when the exposure is performed for an identical wafer by using any combination of the main exposure apparatus body 20a (or 20b) and any one of the main exposure apparatus bodies 20c, 20d, the mix-and-match exposure is consequently performed based on the use of the exposure with the KrF excimer laser and the exposure with the ArF excimer laser.

The multiple layers of circuit patterns are formed on the wafer surface by repeating the steps ranging from the step 106 to the step 114 as described above. After that, in the next step 116, a chip is assembled by using the wafer having been formed with the circuit patterns. Specifically, aluminum electrodes are vapor-deposited on the wafer to connect the respective circuit elements into a circuit, and then the chip is formed and assembled. The assembly process also includes, for example, steps of dicing, bonding, and molding.

In the next step 118, the semiconductor device prepared in the step 116 is subjected to, for example, the test for electric characteristics, the structure inspection, and the test for reliability. After the foregoing production steps are carried out, the semiconductor device is completed (step 120).

As explained above, according to the lithography system 10 concerning this embodiment, the mass flow controllers 38a, 38b, 38c, 38d can be used to adjust the flow amounts of the gases supplied from the plurality of the gas cylinders 34a, 34b, 34c, 34d respectively so that the gases may be supplied to the laser beam sources 36a, 36b, 36c, 36d respectively. Accordingly, it is possible to realize the optimum gas concentrations for the respective laser beam sources 36a, 36b, 36c, 36d by appropriately combining the medium gas such as Kr and Ar, the single gas such as the buffer gas including Ne, and the mixed gas (for example, $F_2$/Ne) comprising the medium gas and the buffer gas. Therefore, no special inconvenience arises even when the composition ratio of Kr and $F_2$ is completely different between the mixed gases as the laser media for the laser beam sources 36a, 36b although the laser beam sources 36a, 36b are based on the same type of KrF laser. The gas supply source is not limited to the gas cylinders 34a, 34d, 34b, 34c. It is also possible to use gas cylinders in which Kr/Ne or Ar/Ne is stored.

The same type of mixed gas is used as the laser medium for the same type of KrF laser such as the laser beam sources 36a, 36b. Therefore, the respective gas components can be supplied from the same gas supply source to the different laser beam sources. Thus, it is possible to simplify the arrangement of the gas supply equipment.

Especially, in this embodiment, the mass flow controllers are provided for each of the laser beam sources.

Accordingly, even when the gas composition of the mixed gas as the laser medium is different, for example, between the laser beam sources 36a, 36b and the laser beam sources 36c, 36d, the respective mass flow controllers can be used to supply the mixed gases having the optimum compositions in conformity with the respective laser beam sources in the desired mixing ratios. Additionally, when the same gas component (in this case, fluorine $F_2$) is contained in the respective laser media as in the laser beam sources 36a, 36b and the laser beam sources 36c, 36d, it is possible to supply fluorine from the same gas cylinder 34b to the respective laser beam sources 36a, 36b, 36c, 36d. Especially, the supply source of the gas such as fluorine $F_2$ which is toxic with strong corrosivity and which requires special care for its handling can be designated to only the gas cylinder 34b as the gas cylinder for the identical fluorine mixed gas (or to a preliminary gas cylinder in addition to the gas cylinder 34b). This fact makes it possible to simplify the arrangement of the gas supply equipment. Further, for example, it is sufficient to provide a small scale of safety equipment such as a gas sensor for monitoring. Thus, the present invention is greatly advantageous in that the management burden is mitigated, and the cost is reduced.

Since the respective laser beam sources 36a, 36b, 36c, 36d are operated at the optimum gas concentrations, the laser oscillation can be performed stably in a well-suited manner even when the system is used for a long period of time. The projection exposure is performed by using the light beam radiated from each of the laser beam sources 36a, 36b, 36c, 36d. Accordingly, the highly accurate exposure performance can be maintained for a long period of time in the main exposure apparatus bodies 20a, 20b, 20c, 20d.

In the method for producing semiconductor devices as described above, the respective laser beam sources 36a, 36b, 36c, 36d can be used in the lithography step to perform the laser oscillation stably in a well-suited manner even when the system is used for a long period of time. The projection exposure is performed by illuminating the masks with the light beams radiated from the laser beam sources. Accordingly, it is possible to realize the good lithography process. Moreover, the mix-and-match exposure, which is based on the use of the KrF laser (laser beam source 36a or 36b) and the ArF laser (laser beam source 36c or 36d), can be easily realized by using the minimum utility equipment (gas supply equipment). Consequently, it is possible to reduce the cost for producing circuit elements.

Second Embodiment

Next, a second embodiment of the present invention will be explained with reference to FIG. 3 In the second embodiment, the same or equivalent constitutive components as those described in the first embodiment are designated by the same reference numerals, explanation of which is simplified or omitted.

Figure 3:
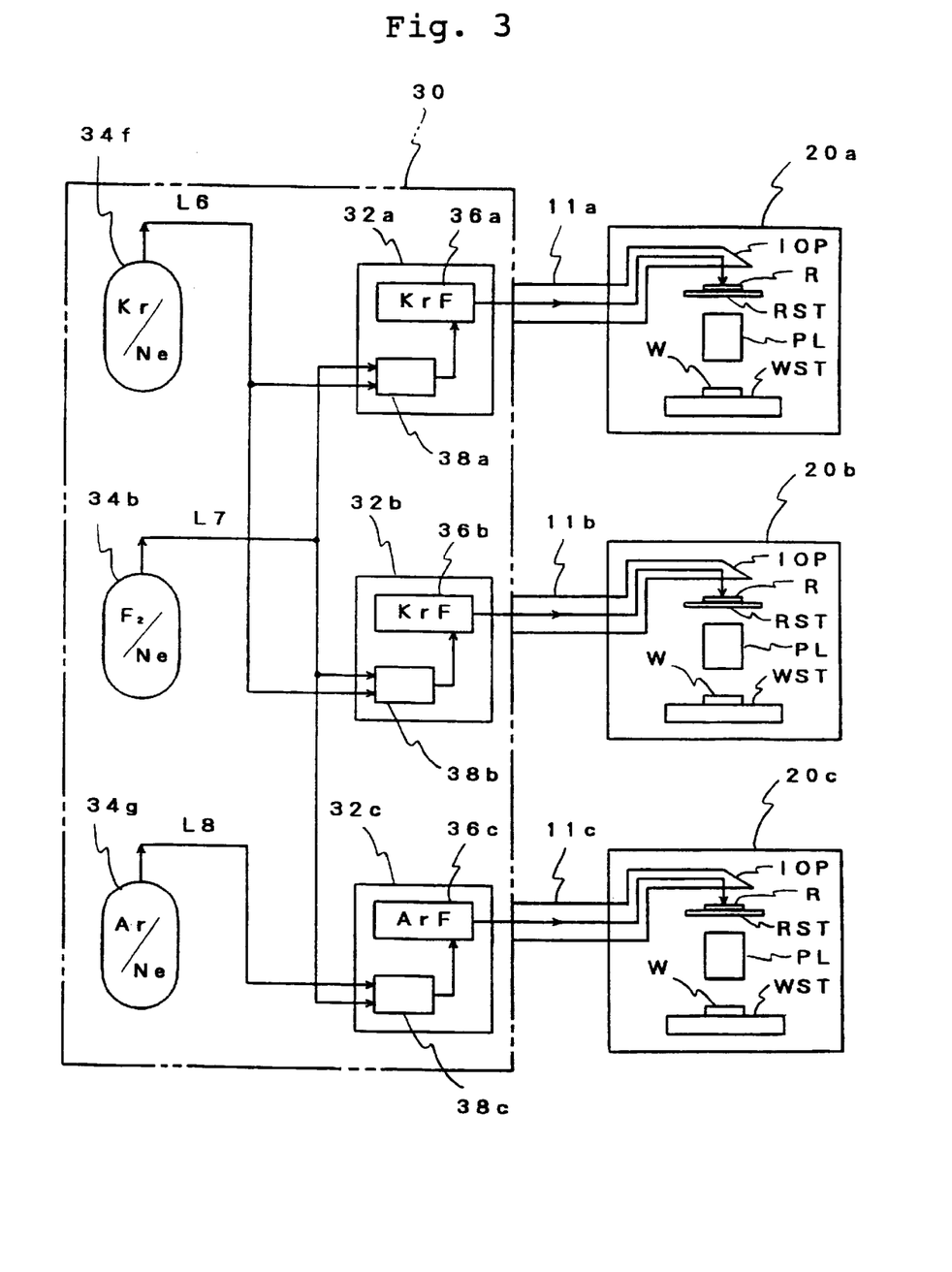
FIG. 3 schematically shows a general arrangement of a lithography system according to a second embodiment.

FIG. 3 schematically shows a general arrangement of a lithography system including exposure apparatuses based on the use of laser apparatuses according to the second embodiment.

The lithography system comprises three main exposure apparatus bodies 20a, 20b, 20c and a laser apparatus 30 including three excimer laser apparatuses 32a, 32b, 32c for constructing exposure light sources for the main exposure apparatus bodies 20a, 20b, 20c. Each of the excimer laser apparatuses 32a, 32b, 32c comprises a laser beam source 36a, 36b, 36c and a mass flow controller 38a, 38b, 38c.

Each of the main exposure apparatus bodies 20a, 20b uses a KrF laser beam, and the main exposure apparatus body 20c uses an ArF laser beam. Each of the laser beam sources 36a, 36b is a KrF excimer laser, and the laser beam source 36c is an ArF excimer laser.

An $F_2$/Ne gas is stored in a gas cylinder 34b in the same manner as that shown in FIG. 1. A pipe line L7 is connected between the gas cylinder 34b and the mass flow controllers 38a, 38b, 38c. The $F_2$/Ne gas is supplied via the pipe line L7 to the mass flow controllers 38a, 38b, 38c. A two-component mixture Kr/Ne gas is stored in a gas cylinder 34f. A pipe line L6 is connected between the gas cylinder 34f and the mass flow controllers 38a, 38b. The Kr/Ne gas is supplied via the pipe line L6 to the mass flow controllers 38a, 38b. A two-component mixture Ar/Ne gas is stored in a gas cylinder 34g. A pipe line L8 is connected between the gas cylinder 34g and the mass flow controller 38c. The Ar/Ne gas is supplied via the pipe line L8 to the mass flow controller 38c.

The $F_2$/Ne gas from the pipe line L7 and the Kr/Ne gas from the pipe line L6 are supplied to the mass flow controllers 38a, 38b. The $F_2$/Ne gas from the pipe line L7 and the Ar/Ne gas from the pipe line L8 are supplied to the mass flow controller 38c. The second embodiment is characterized in that all of the gases supplied to the respective mass flow controllers contain the buffer gas Ne. A gas cylinder for He gas, which is used for maintenance, is omitted.

The same laser medium is used for the laser beam sources 36a, 36b, however, the composition ratio of gas components is different therebetween. The type of the composition gas of the laser medium is different between the laser beam sources 36a, 36b and the laser beam source 36c. However, the respective flow amounts of the gases supplied from the respective gas cylinders are controlled by using the mass flow controllers 38a, 38b, 38c so that the same gas compositions as those used in the first embodiment are given to perform injection into the laser beam sources 36a, 36b, 36c. Therefore, the mixed gases having the optimum mixing ratios and the optimum amounts as the KrF excimer laser media are supplied to the laser beam sources 36a, 36b. The mixed gas having the optimum mixing ratio (concentration) and the optimum amount as the ArF excimer laser medium is supplied to the laser beam source 36c. In the laser beam sources 36a, 36b, the laser oscillation is effected to output the KrF laser beam by exciting, with short pulse large current discharge, the mixed gas of Kr and $F_2$ in the optimum mixing ratio adjusted for the flow amounts of the respective gases by the aid of the mass flow controllers 38a, 38b. The KrF laser beam is introduced into the main exposure apparatus bodies 20a, 20b via BMU's 11a, 11b respectively to perform the exposure in the same manner as described in the first embodiment. In the laser beam source 36c, the laser oscillation is effected to output the ArF laser beam by exciting, with short pulse large current discharge, the mixed gas of Ar and $F_2$ in the optimum mixing ratio adjusted for the flow amounts of the respective gases by the aid of the mass flow controller 38c. The ArF laser beam is introduced into the main exposure apparatus body 20c via BMU 11c to perform the exposure in the same manner as described in the first embodiment.

According to the second embodiment of the present invention described above, it is possible to obtain an effect equivalent to that obtained in the first embodiment. Further, it is possible to omit the gas cylinder to be exclusively used for supplying the buffer gas (Ne). Therefore, the arrangement of the system is further simplified.

The first and second embodiments have been explained for the case in which the laser beam sources are the KrF and ArF excimer lasers. However, the present invention is not limited thereto. It is possible to appropriately employ a laser beam source based on the use of a mixed gas as a laser medium. For example, it is possible to appropriately employ a laser beam source based on the use of $F_2$, KrCl (krypton chloride), XeF (xenon fluoride), and XeCl (xenon chloride) as a laser medium.

It is a matter of course that the number of laser beam sources and the number of gas supply sources are not limited to those described in the foregoing embodiments. It is allowable to provide a preliminary laser beam source and a preliminary gas cylinder. In such an arrangement, it is possible to easily exchange the laser beam source and the gas cylinder and arrange the preliminary ones. No special inconvenience arises even when the light source and the gas cylinder are exchanged with those of different types (or those produced by different makers) provided that certain conditions are satisfied. Therefore, the maintenance of the system is easy.

The foregoing embodiments have been explained for the case in which the laser apparatus according to the present invention is used as the exposure light source for the reduction projection exposure apparatus (stepper) based on the step-and-repeat system. However, the present invention is not limited thereto. The laser apparatus according to the present invention may be of course used for the exposure apparatus based on the step-and-scan system, as well as for other apparatuses, for example, for a light source for a laser beam machining apparatus. The method for producing circuit elements has been explained for only the method for producing semiconductor devices. However, there is no limitation thereto. The present invention is also applicable to a method for producing liquid crystal display devices.

As explained above, according to the laser apparatus, the exposure apparatus, and the lithography system concerning the present invention, the supply source of the toxic gas can be minimized especially when the toxic gas or the like is contained in the medium gas. Therefore, for example, it is possible to mitigate the management burden and reduce the cost. The laser beam source can perform laser oscillation in a well-suited manner for a long period of time. Therefore, it is possible for the main exposure apparatus body to maintain the highly accurate exposure performance for a long period of time.

Since the supply source of the toxic gas can be minimized, for example, it is possible to mitigate the management burden and reduce the cost. Accordingly, it is easy to introduce, for example, the mix-and-match exposure system for performing the exposure based on the use of the KrF excimer laser and the exposure based on the use of the ArF excimer laser, from viewpoints of the space and the cost.

According to the method for producing circuit elements concerning the present invention, the equipment to be used for production is allowed have a further simple arrangement. Consequently, it is possible to reduce the cost for producing circuit elements.

What is claimed is:

1. A laser apparatus comprising:
    a plurality of laser beam sources which use, as laser media, mixed gases containing at least one common gas component;
    at least one common gas supply source which supplies, to the respective laser beam sources, the common gas component; and
    a gas flow amount-adjusting unit which adjusts a flow amount of the common gas component supplied from the common gas supply source.

2. The laser apparatus according to claim 1, wherein the gas flow amount-adjusting unit adjusts flow amounts of other gas components for constituting the mixed gases.

3. The laser apparatus according to claim 2, wherein the gas flow amount-adjusting unit adjusts the flow amounts of the common gas component and the other gas components prior to supplying the common gas component and the other gas components to the respective gas laser beam sources.

4. The laser apparatus according to claim 1, wherein the gas flow amount-adjusting unit has a plurality of mass flow controllers.

5. The laser apparatus according to claim 4, wherein a different one of the plurality of mass flow controllers is provided for each of the laser beam sources.

6. The laser apparatus according to claim 1, wherein the flow amount-adjusting unit mixes the common gas component and one of other gas components in a desired mixing ratio.

7. The laser apparatus according to claim 1, wherein the number of the at least one common gas supply source is fewer than the number of the laser beam sources.

8. The laser apparatus according to claim 1, wherein the laser beam sources comprise a combination of excimer lasers selected from a group consisting of KrF and ArF excimer lasers, KrF and KrF excimer lasers, and ArF and ArF excimer lasers, and the common gas component is fluorine.

9. The laser apparatus according to claim 1, further comprising a source for supplying a common gas containing an inert gas, wherein the inert gas is supplied in desired flow amounts to the respective laser beam sources by the aid of the flow amount-adjusting unit.

10. An exposure apparatus for illuminating masks with light beams radiated from laser beam sources, and exposing a substrate with patterns formed on the masks, the exposure apparatus comprising:
    a plurality of laser beam sources which use, as laser media, mixed gases containing at least one common gas component;
    a plurality of exposure apparatus bodies which expose the substrate with the light beams radiated from the plurality of laser beam sources;
    a common gas supply source which supplies the common gas component; and
    a gas flow amount-adjusting unit which adjusts a flow amount of the common gas component supplied from the common gas supply source.

11. The exposure apparatus according to claim 10, wherein the gas flow amount-adjusting unit adjusts flow amounts of other gas components for constituting the mixed gases.

12. The exposure apparatus according to claim 11, wherein the gas flow amount-adjusting unit adjusts the flow amounts of the common gas component and the other gas components prior to supplying the common gas component and the other gas components to the respective gas laser beam sources.

13. The exposure apparatus according to claim 10, wherein the gas flow amount-adjusting unit has a plurality of mass flow controllers.

14. The exposure apparatus according to claim 13 wherein a different one of the plurality of mass flow controllers is provided for each of the laser beam sources.

15. The exposure apparatus according to claim 10, wherein the flow amount-adjusting unit mixes the common gas component and one of other gas components in a desired mixing ratio.

16. The exposure apparatus according to claim 10, wherein the laser beam sources comprise a combination of excimer lasers selected from a group consisting of KrF and ArF excimer lasers, KrF and KrF excimer lasers, and ArF and ArF excimer lasers, and the common gas component is fluorine.

17. The exposure apparatus according to claim 10, further comprising a source for supplying a common gas containing an inert gas, wherein the inert gas is supplied in desired flow amounts to the respective laser beam sources by the aid of the flow amount-adjusting unit.

18. A lithography system to be used for an exposure step performed on an identical production line, the lithography system comprising:
   a plurality of exposure apparatus bodies each of which is installed on the identical production line to form an image on a substrate by a laser beam;
   a plurality of laser beam sources coupled to the exposure apparatus bodies, respectively, to provide laser beams to the respective exposure apparatus bodies, wherein the laser beam sources use laser gases containing at least one common gas component;
   a common gas supply source coupled to the laser beam sources to supply the common gas component to the laser beam sources, respectively; and
   at least one gas flow amount-adjusting unit disposed between the laser beam sources and the common gas supply source to adjust flow amounts of the common gas component supplied from the common gas supply source and other gas components for constituting the laser gases.

19. The lithography system according to claim 18, comprising, on the identical line, an exposure apparatus body based on the use of a KrF excimer laser as at least one of the laser beam sources and an exposure apparatus body based on the use of an ArF excimer laser as at least one of the laser beam sources.

20. The lithography system according to claim 19, comprising, on the identical line, a pair of the exposure apparatus bodies based on the use of KrF excimer lasers as the laser beam sources and a pair of the exposure apparatus bodies based on the use of ArF excimer lasers as the laser beam sources.

21. The lithography system according to claim 20, wherein the pair of KrF excimer lasers use KrF mixed gases having mixing ratios which are different from each other.

22. The lithography system according to claim 20, wherein the pair of ArF excimer lasers use ArF mixed gases having mixing ratios which are different from each other.

23. The lithography system according to claim 18, comprising, on the identical line, an exposure apparatus body based on the use of an ArF excimer laser as at least one of the laser beam sources and an exposure apparatus body based on the use of an ArF excimer laser as at least one of the laser beam sources.

24. The lithography system according to claim 18, comprising, on the identical line, the exposure apparatus body based on the use of a KrF excimer laser as at least one of the laser beam sources and the exposure apparatus body based on the use of a KrF excimer laser as at least one of the laser beam sources.

25. The lithography system according to claim 18, wherein the flow amount-adjusting unit mixes the common gas component supplied from the common gas supply source and one of the other gas components in a desired mixing ratio.

26. The lithography system according to claim 18, further comprising a source which supplies a common gas containing an inert gas, wherein the inert gas is supplied in desired flow amounts to the respective laser beam sources by the aid of the flow amount-adjusting unit.

27. A method for producing circuit elements, comprising a lithography step, the method further comprising the steps of using a common gas supplied from a common gas supply source, as a component of a first mixed gas for constituting a gas laser medium for a first laser beam source; using the common gas supplied from the common gas supply source, as a component of a second mixed gas for constituting a gas laser medium for a second laser beam source; irradiating a first mask with a laser beam having a wavelength $\lambda 1$ oscillated from the first laser beam source to expose a substrate with a pattern formed on the first mask; and irradiating a second mask with a laser beam having a wavelength $\lambda 2$ oscillated from the second laser beam source to expose the substrate with a pattern formed on the second mask.

28. The method according to claim 27, wherein the common gas supplied from the common gas supply source is mixed with certain gas component of the first mixed gas for constituting the gas laser medium for the first laser beam source.

29. The method according to claim 27, wherein the common gas supplied from the common gas supply source is mixed with certain gas component of the second mixed gas for constituting the gas laser medium for the second laser beam source.

30. The method according to claim 27, wherein the common gas is fluorine gas.

31. The method according to claim 27, wherein the wavelength $\lambda 1$ is different from the wavelength $\lambda 2$.

32. The method according to claim 27, wherein the wavelength $\lambda 1$ is same as the wavelength $\lambda 2$.

33. A gas supply system which supplies laser gases to a plurality of laser beam sources comprising:
   at least one common gas supply source which supplies, to the respective laser beam sources, a common gas component for constituting the laser gases; and
   a gas flow amount-adjusting unit which adjusts a flow amount of the common gas component supplied from the common gas supply source;
   wherein at least one of the laser gases is a mixed gas including the common gas component and at least one other gas component.

34. The gas supply system according to claim 33, wherein the gas flow amount-adjusting unit adjusts a flow amount of the at least one other gas component for constituting the at least one of the laser gases.

35. The gas supply system according to claim 34, wherein the gas flow amount-adjusting unit adjusts the flow amounts of the common gas component and the at least one other gas component prior to supplying the common gas component and the at least one other gas component to the respective gas laser beam sources.

36. The gas supply system according to claim 34, wherein the gas flow amount-adjusting unit mixes the common gas component and the at least one other gas component so as to obtain predetermined mixing ratios for the respective laser beam sources.

37. The gas supply system according to claim 33, wherein the gas flow amount-adjusting unit has a plurality of mass flow controllers.

38. The gas supply system according to claim 33, further comprising a source for supplying a common gas containing an inert gas, wherein the inert gas is supplied in desired flow amounts to the respective laser beam sources by the aid of the flow amount-adjusting unit.

39. The gas supply system according to claim 33, wherein the number of the at least one common gas supply source is fewer than the number of the laser beam sources.

40. The gas supply system according to claim 33, wherein the laser beam sources comprise a combination of excimer lasers selected from a group consisting of KrF and ArF excimer lasers, KrF and KrF excimer lasers, and ArF and ArF excimer lasers, and the common gas component is fluorine.

41. A gas supply system which supplies laser gases to a plurality of laser beam sources comprising:
- a first common gas supply source coupled to the plurality of laser beam sources to supply, to the respective laser beam sources, a first common gas component for constituting the laser gases; and
- a second common gas supply source coupled to the plurality of laser beam sources to supply, to the respective laser beam sources, a second common gas component for constituting the laser gases.

42. The gas supply system according to claim 41, further comprising an adjusting unit which is disposed between the first common gas supply source and the laser beam sources and adjusts supply amounts of the first common gas component to the respective laser beam sources.

43. The gas supply system according to claim 41, further comprising an adjusting unit which is disposed between the second common gas supply source and the laser beam sources and adjusts supply amounts of the second common gas component to the respective laser beam sources.

44. A method for supplying laser gases to a plurality of laser beam sources comprising:
- supplying at least one common gas for constituting the laser gases to the respective laser beam sources; and
- adjusting a flow amount of the common gas;
- wherein at least one of the laser gases is a mixed gas including the common as and at least one other gas.

45. The method according to claim 44, further comprising illuminating a substrate with a laser beam from one of the laser beam sources to which the common gas was supplied, and forming a circuit pattes on the substrate to manufacture a circuit element.

46. The method according to claim 44, wherein the flow amount of the common gas is adjusted so that different flow amounts are supplied to the respective laser beam sources.

47. A laser apparatus used together with another laser apparatus comprising:
- a laser beam source which uses, as laser media, a laser gas including at least one common gas component used in another laser source of the another laser apparatus;
- a gas supply source coupled to the laser beam source to supply the common gas component to the laser beam source and to the another laser beam source; and
- an adjusting unit disposed between the laser beam source and the gas supply source to independently adjust an amount of the common gas component of the laser beam source from an amount of the common gas component of the another laser beam source;
- wherein the laser gas is a mixed gas including the common gas component and at least one other gas component.

48. The laser apparatus according to claim 47, which is utilized with an exposure apparatus.

49. An exposure apparatus which forms an image on a substrate, the exposure apparatus comprising:
- an exposure apparatus body disposed on a production line to form the image on the substrate by a laser beam;
- a laser beam source which is coupled to the exposure apparatus body to provide the laser beam to the exposure apparatus body, and which uses, as laser media, a laser gas including at least one common gas component used in another laser source;
- a gas supply source coupled to the laser beam source to supply the common gas component to the laser beam source and to the another laser beam source; and
- an adjusting unit disposed between the laser beam source and the gas supply source to independently adjust an amount of the common gas component of the laser beam source from an amount of the common gas component of the another laser beam source;
- wherein the laser gas is a mixed gas including the common gas component and at least one other gas component.

50. The exposure apparatus according to claim 49, wherein the adjusting unit has a mass flow controller which adjusts the flow amount of the common gas component.

51. The exposure apparatus according to claim 49, wherein the laser beam source oscillates a laser light with a different wavelength from a wavelength of a laser light oscillated from the another laser beam source.

52. A laser apparatus comprising:
- a plurality of laser beam sources which provide laser beams, respectively, wherein the laser beam sources use, as laser media, laser gases containing at least one common gas component;
- at least one common gas supply source coupled to the respective laser beam sources to supply the common gas component to the respective laser beam sources; and
- an adjusting unit disposed between the laser beam sources and the common gas supply source to adjust an amount of the common gas component supplied from the common gas supply source for the respective laser beam sources;
- wherein at least one of the laser gases is a mixed gas including the common gas component and at least one other gas component.

53. The laser apparatus according to claim 52, wherein the adjusting unit has a mass flow controller which adjusts the flow amount of the common gas component and is connected to the respective laser beam sources.

54. The laser apparatus according to claim 52, wherein the adjusting unit adjusts the amount of the common gas component so that different flow amounts are supplied to the respective laser beam sources.

55. An exposure apparatus which forms an image on a substrate, the exposure apparatus comprising:
- a plurality of exposure apparatus bodies disposed on a production line to form the image on the substrate by a laser beam;
- a plurality of laser beam sources coupled to the respective exposure apparatus bodies to provide the laser beam to the respective exposure apparatus bodies, wherein the laser beam sources use laser gases containing at least one common gas component;
- at least one common gas supply source coupled to the respective laser beam sources to supply the common gas component to the respective laser beam sources; and
- an adjusting unit disposed between the laser beam sources and the common gas supply source to adjust an amount of the common gas component supplied from the common gas supply source for the respective laser beam sources;

wherein at least one of the laser gases is a mixed gas including the common gas component and at least one other gas component.

56. The exposure apparatus according to claim 55, wherein the adjusting unit adjusts the amount of the common gas component so that different flow amounts are supplied to the respective laser beam sources.

57. The exposure apparatus according to claim 55, wherein the laser beam sources oscillate laser lights with different wavelengths, respectively.

* * * * *